United States Patent
Mardi et al.

(10) Patent No.: US 7,352,197 B1
(45) Date of Patent: Apr. 1, 2008

(54) OCTAL/QUAD SITE DOCKING COMPATIBILITY FOR PACKAGE TEST HANDLER

(75) Inventors: Mohsen Hossein Mardi, Fremont, CA (US); David M. Mahoney, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 71 days.

(21) Appl. No.: 11/106,336

(22) Filed: Apr. 14, 2005

(51) Int. Cl.
*G01R 31/02* (2006.01)
(52) U.S. Cl. ........................ 324/755; 324/765
(58) Field of Classification Search ................ 324/754, 324/755, 758, 765, 760
See application file for complete search history.

(56) References Cited

U.S. PATENT DOCUMENTS

| | | | | |
|---|---|---|---|---|
| 4,933,808 A | * | 6/1990 | Horton et al. | 361/715 |
| 5,528,466 A | * | 6/1996 | Lim et al. | 361/820 |
| 5,694,049 A | * | 12/1997 | Singh et al. | 324/755 |
| 5,828,223 A | * | 10/1998 | Rabkin et al. | 324/754 |
| 6,407,566 B1 | * | 6/2002 | Brunelle et al. | 324/758 |
| 6,628,129 B2 | * | 9/2003 | Vizcara et al. | 324/755 |
| 6,887,723 B1 | * | 5/2005 | Ondricek et al. | 438/14 |

* cited by examiner

*Primary Examiner*—Ha Tran Nguyen
*Assistant Examiner*—Arleen M. Vazquez
(74) *Attorney, Agent, or Firm*—Thomas A. Ward; W. Eric Webostad

(57) ABSTRACT

A test system configuration is provided to enable testing of integrated circuit (IC) packages. The test system includes a test controller, an interface apparatus including a PC board with lines connecting the test controller to contact areas for contacting the IC packages and a handler for supporting the IC chips and interface apparatus to maintain electrical connections during testing. The handler includes docking plates for attaching to the PC board to provide a guide for the IC packages that are inserted in openings of the docking plates to align contacts of the IC packages and PC board. The docking plates are configured to provide quad (four) and octal (eight) test sites, with either the quad or octal docking plate mating to the same PC board and being supported in the same handler system. An alignment frame for mounting either the quad or octal docking plate is further provided as part of the handler.

13 Claims, 5 Drawing Sheets

OCTAL/QUAD SITE DOCKING COMPATIBILITY FOR PACKAGE TEST HANDLER

BACKGROUND

1. Technical Field

The present invention relates to integrated circuit device testers, and more particularly to a package test handler for supporting a number of packaged integrated circuits during testing.

2. Related Art

Integrated circuit (IC) devices typically include an IC chip that is housed in a plastic, ceramic or metal package. The IC chip typically includes a circuit fabricated by lithographically patterning conductive and insulating materials on a thin wafer of semiconductor using known fabrication techniques. The package supports and protects the IC chip and provides electrical connections between the circuit and an external circuit or system.

IC devices are tested after manufacture to assure they meet performance specifications before shipment to customers. ICs undergoing such tests include Programmable Logic Devices (PLDs) that are capable of implementing digital logic operations. There are several types of PLDs, including Field Programmable Gate Arrays (FPGAs) and Complex Programmable Logic Devices (CPLDs).

Modern PLDs are highly complex and often include more than one hundred Input/Output structures and associated bonding pads that access the programmable logic circuitry therein. To support the large number of I/O structures, PLDs are typically mounted in a package including multiple external contacts (e.g., pins, solder balls/bumps, or wire leads). Several package types are used to house PLD chips, including ball grid arrays (BGAs), pin grid arrays (PGAs), plastic leaded chip carriers, and plastic quad flat packs. The package type selected by an IC manufacturer for a particular IC chip is typically determined by the size/complexity of the IC chip (i.e., the number of input/output terminals), and also in accordance with a customer's requirements.

FIG. 1 shows a side cross-sectional view of a typical IC 100 including an IC chip 110 mounted on an upper surface 122 of a package substrate 120. Electrical connections between bonding pads 115 of IC chip 110 and contact pads 125 formed on upper surface 122 of substrate 120 are provided by bond wires 130. A plurality of solder balls 126 extend from a lower surface of substrate 120 which are electrically connected to the conductive lines (not shown) and conductive vias 128 that are provided on substrate 120. Electrical signals travel between each solder ball 126 and one bonding pad 115 of IC chip 110 along an associated conductive via 128 and bond wire 130.

IC manufacturers typically use IC testing systems to test their packaged IC devices before shipping to customers. IC testing systems typically include a device tester, a device handler and an interface apparatus. A device tester is an expensive piece of computing equipment that transmits test signals to the IC device under test via tester probes and the interface apparatus. The interface apparatus is typically a printed circuit (PC) board that connects to the device tester with lines running from the tester to contacts for connecting to package connections (pins or balls). A device handler is an expensive robot that precisely supports the interface apparatus and automatically moves IC devices from a storage area to contact the interface apparatus and then puts the packages back into the storage area. Such testing systems are well known.

FIG. 2 shows a side cross-sectional view of a conventional package test interface apparatus, with supporting handler components connected to test an IC package. The interface apparatus includes a PC board 210 having mounted thereon a plurality of contact members (i.e., pogo pins) 220 and a contactor body 240. PCB 210 includes connection structures (not shown) for receiving test signals from a device tester, and conductive lines (also not shown) for transmitting signals between the connection structures and pogo pins 220. Contactor body 240 includes four walls that are formed into a generally square or rectangular frame through which pogo pins 220 extend. A non-conductive plate 250 is mounted on an upper surface of contactor body 240 for aligning pogo pins 220 such that a tip 224 of each pogo pin 220 is aligned to mate with contacts 126 on a chip package 100. Mounted on an upper surface of plate 250 is a package handler docking plate 270 with an opening area 275 that functions to align the contacts 126 of package 100 with pogo pins 220 of the interface apparatus. Alignment pins 200 are provided through holes secure the package handler to the printed circuit board 210 to provide precise alignment so that the pitch of the package contacts matches the pitch of the pogo pins 220.

During a test procedure, an IC package 100 is lowered into IC receiving area 275 of package handler docking plate 270 by a device handler arm 280 that fixedly holds the package 100. Alignment structures 270 are formed with slanted walls 277 that facilitate "rough" alignment by causing the package IC 100 to slide into IC receiving area 275. Subsequently, of each solder balls 126 become engaged to provide "fine" alignment relative to pogo pins 220.

Although the contacts are shown as pogo pins 220 with supports 240 and 250 to align the pogo pins 220 to contact the package contacts, other type connections are attachable to the PC board 210 of the interface apparatus. Instead of pogo pins 220, metal contact bumps can be used with the support structures 240 and 250 being unnecessary. Similarly, if the IC package has a lead frame instead of a ball grid array for contacts, the pogo pins 220 can be replaced by sockets to contact the leads. In either case, a docking plate 270 with slanted walls 277 and/or alignment holes for inserting pins 200, can form part of the handler to guide the IC package contacts so they align with contacts on the PC board 210.

For a typical handler, a maximum of four IC packages are typically tested at one time because of limitations of the handler allowing testing of only a limited number of ICs with a large package size and/or a large pin count, such as with FPGAs or CPLDs. The complete handler docking plate 270, thus has four openings 275 for inserting IC packages, creating a quad site docking plate 270 as part of the package test handler attachable to the PC board 210.

With multiple layered PC boards, connection lines can be distributed through the layers of the interface apparatus to enable more than four IC package connection sites to be provided on a PC board. The handler for one interface apparatus package site configuration, however will typically not fit an interface apparatus with a second package site interface configuration. Because of the high cost of the robotic handler, purchasing a new handler to accommodate more than one interface apparatus configuration is typically prohibitively expensive. Continued use of an old handler that tests only a few IC packages at a time must be weighed against the expense of purchasing a new handler to test more IC packages at one time.

It is desirable to provide a handler that can be configured to be used with more than one interface apparatus, without suffering the costs of purchasing a new handler. Further, it is desirable to make a handler adaptable so that old interface apparatuses may be continually used that test a lower number of IC packages until the interface apparatus wears out, while new interfaces that test a greater number of IC packages at one time are integrated into a test system.

SUMMARY

In accordance with embodiments of the present invention, a configuration of handler docking plates is provided so that one handler can be used to test different numbers of IC package chips.

The handler docking plates include a first quad site handler docking plate and additionally an octal site handler docking plate. The handler docking plates are aligned so that the openings for IC packages in the quad handler docking plate fit over the center four openings for IC packages in the octal handler docking plate. Both handler docking plates have holes or taps that will mate to holes or pins on a PC board with four or eight IC package contact sites. The PC board will have the same size and attachment holes to attach to the quad or octal handler docking plates, whether the PC board has four or eight IC package contact sites.

The handler further includes an frame to engage either the quad or octal handler docking plates. The handler frame provides an alignment reference for the robotic arm that carries the IC packages. The alignment frame fits around extended walls of either the quad or octal handler docking plates, and includes common holes, taps or pins for connecting to either docking plate.

Both the quad and octal docking plates have similar openings to accept IC packages with slanted edges that facilitate "rough" alignment to cause the IC package to slide into an IC receiving area on the interface PC board. The quad site slanted surfaces in one embodiment are at right angles to the slanted surfaces on the octal handler.

Although the octal site handler has additional holes to accommodate support pins or screws for support and alignment of its larger size relative to the quad site handler, both the octal and quad site handlers have a number of common openings for support pins or screws allowing them to be both used on the same interface PC board. If octal site docking plates are not available when testing using an interface PC board supporting eight IC sites, the quad site docking plate can be used with the eight site PC board although only four IC packages can be tested at one time.

BRIEF DESCRIPTION OF THE DRAWINGS

Further details of the present invention are explained with the help of the attached drawings in which.

DETAILED DESCRIPTION

Figure 1:
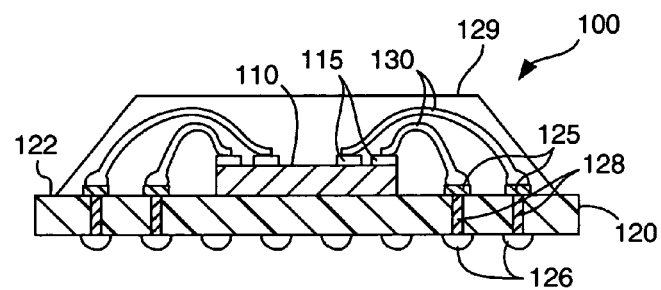
FIG. 1 shows a side cross-sectional view of a typical IC mounted in an IC package.
Figure 2:
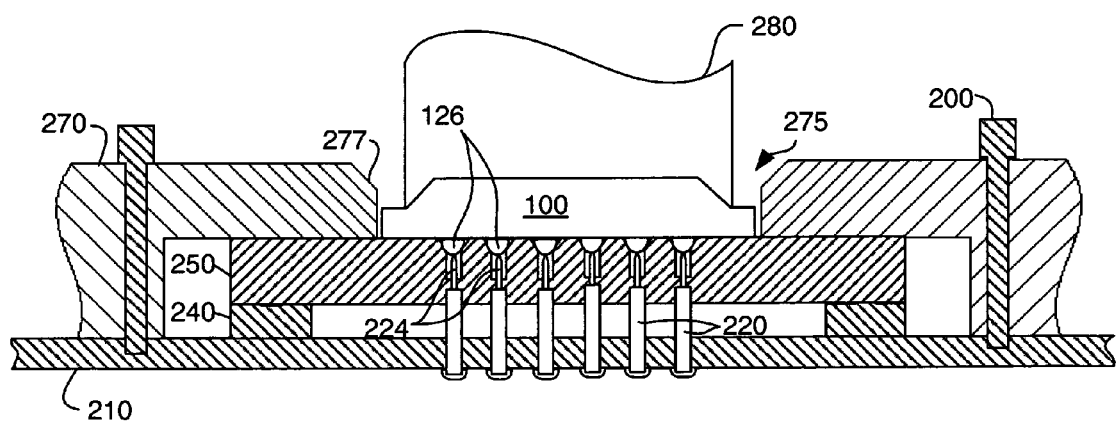
FIG. 2 shows a side cross-sectional view of a conventional package test interface apparatus with supporting handler components testing an IC package.
Figures 3, 4:
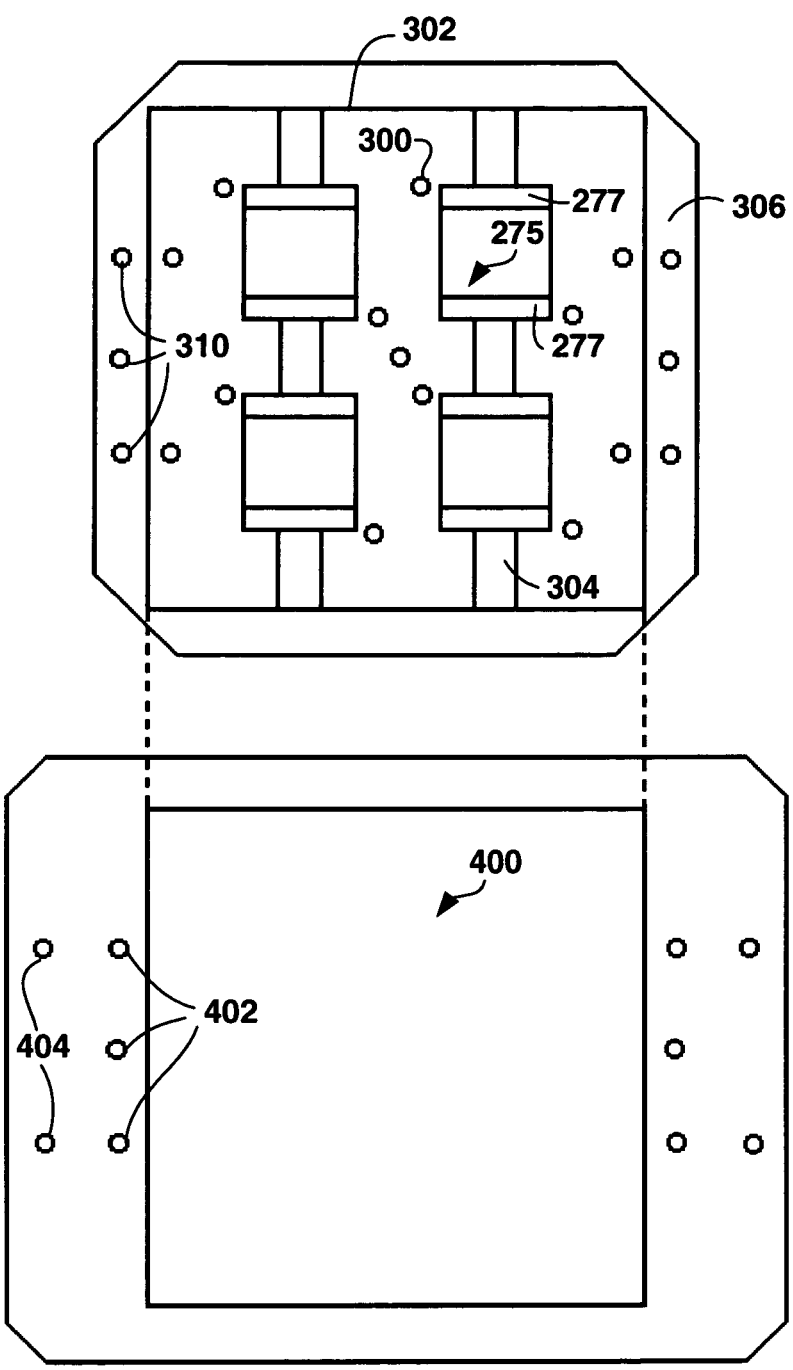
FIG. 3 shows a top view of a quad handler docking plate.
FIG. 4 shows a handler frame for aligning a robotic handler arm carrying IC packages with the quad handler docking plate of FIG. 3.

FIG. 3 shows a top view of one configuration of a quad handler docking plate that can form the docking plate 270 shown in FIG. 2. The quad handler docking plate shown has four openings 275 through which an IC package is passed to align its electrical contacts with electrical contacts on a PC board (210 of FIG. 2) of an interface apparatus. Slanted walls 277 on one set of opposing walls of the openings 275 facilitate "rough" alignment by causing the package IC to slide into the IC receiving area 275.

The quad handler docking plate of FIG. 3 further includes holes 300 within an extended wall area 302 to allow mating with corresponding holes on a PC board of an interface apparatus. Although referenced as holes 300 that may be aligned and attached to holes on a corresponding PC board by slots or screws, the holes may instead be alignment pins. The holes 300 allow precise alignment of openings 275 for IC packages 275 around corresponding contact sites on a mating PC board.

The quad handler docking plate of FIG. 3 further includes slots 304 cut into the extended wall area 302 that feed into the slanted areas 277 of the IC receiving area 275. The slots provide a guide for the robotic arm holding IC packages to roughly align the IC package so that it easily fits into the receiving areas 275.

The quad handler docking plate of FIG. 3 further includes a recessed edge region 306 around the extended wall area 302. The edge region 306 provides an attachment area to attach the quad handler docking plate of FIG. 3 to a handler frame as shown in FIG. 4. The extended wall area 302 fits into an opening 400 in the handler frame as illustrated by the dashed lines. Holes 402 on the handler frame mate with corresponding holes 310 in the edge region 306 on the quad handler docking plate of FIG. 3 to allow attachment of the frame and docking plate. Note that although shown as holes 402, the holes may be pins or other means for attachment. Additional holes 404 allow for attachment of the frame to the robotic handler arm.

Figure 5:
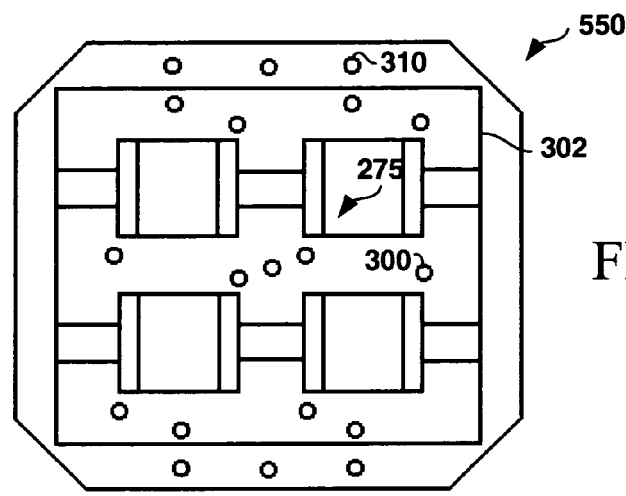
FIG. 5 repeats the top view of the quad handler docking plate rotated by 90 degrees for comparison to the quad handler of FIG. 6.
Figure 6:
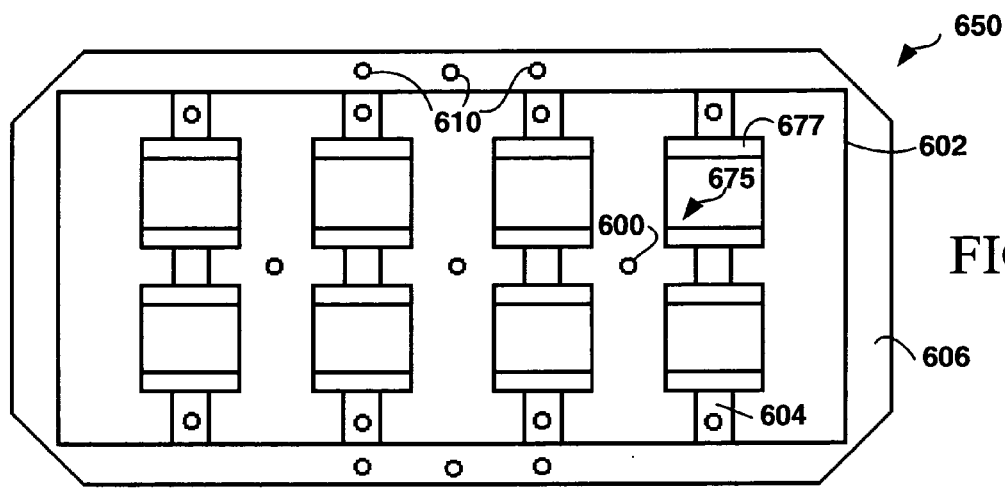
FIG. 6 shows a top view of an octal handler docking plate.
Figure 7:
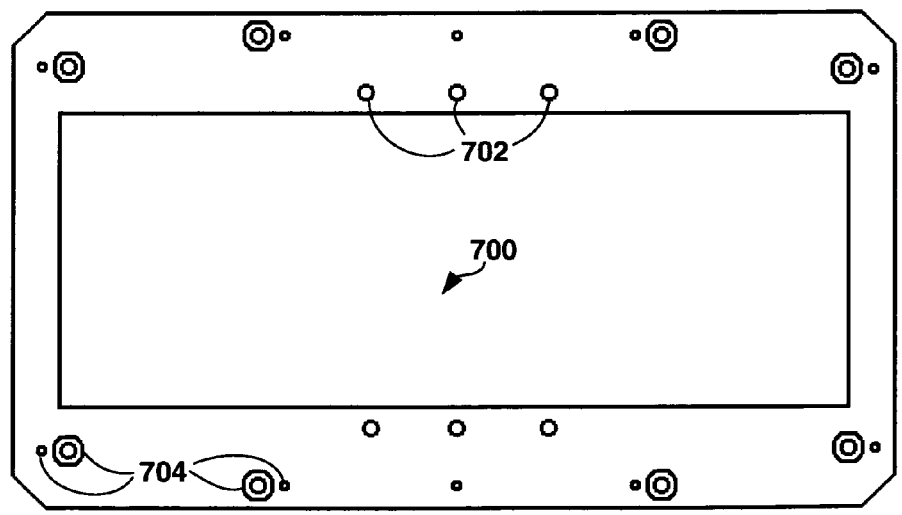
FIG. 7 shows a handler frame for aligning a robotic handler arm carrying IC packages with either the quad handler docking plate of FIG. 5 or the octal handler docking plate of FIG. 6.

FIG. 5 shows the quad handler docking plate 550 of FIG. 3 rotated 90 degrees, showing its alignment with an additional octal handler docking plate 650 of FIG. 6, and an additional handler frame shown in FIG. 7. The octal handler docking plate 650 of FIG. 6 includes eight openings 675. The four center openings for IC packages of the octal handler docking plate 650 of FIG. 6, align with the four openings 275 of the quad handler docking plate of FIG. 5. Slanted walls 677 on one set of opposing walls of the openings 675 facilitate "rough" alignment by causing an IC package to slide into the IC receiving area 675. Although rotation of the slanted walls 677 in the quad handler is shown, such rotation is dependent on the configuration of the handler and may not be necessary depending on the handler used.

The octal handler docking plate of FIG. 6 further includes holes, or pins 600 within an extended wall area 602 to allow mating with corresponding holes on a PC board of an interface apparatus. Note that holes 600 correspond to holes 300 in the docking plate of FIG. 5 and are aligned to allow both plates to be attached to the same PC board. The octal handler docking plate of FIG. 6 further includes slots 604 cut into the extended wall area 602 that feed into the slanted areas 677 of the IC receiving area 675. As with the handler of FIG. 3, the slots 604 of FIG. 6 provide a guide for the robotic arm holding IC packages to roughly align the IC package so that it easily fits into the receiving areas 675.

The octal handler of FIG. 6, like the quad handler further includes a recessed edge region 606 around the extended wall area 602. The edge region 606 provides an attachment area to attach the octal handler docking plate of FIG. 7. The extended wall area 602 fits into an opening 700 in the handler frame, as does the extended wall 302 of the quad frame of FIG. 5. Holes 702 on the handler frame mate with corresponding holes in the edge region 606 on the octal handler docking plate of FIG. 6, as well as holes 310 of the quad docking plate of FIG. 5 to allow attachment of the frame and either docking plate. Note that although shown as holes 702, the holes may be pins or other means for attachment. Additional holes and pins 704 allow for attachment of the frame to the robotic handler arm.

Figures 8, 9:
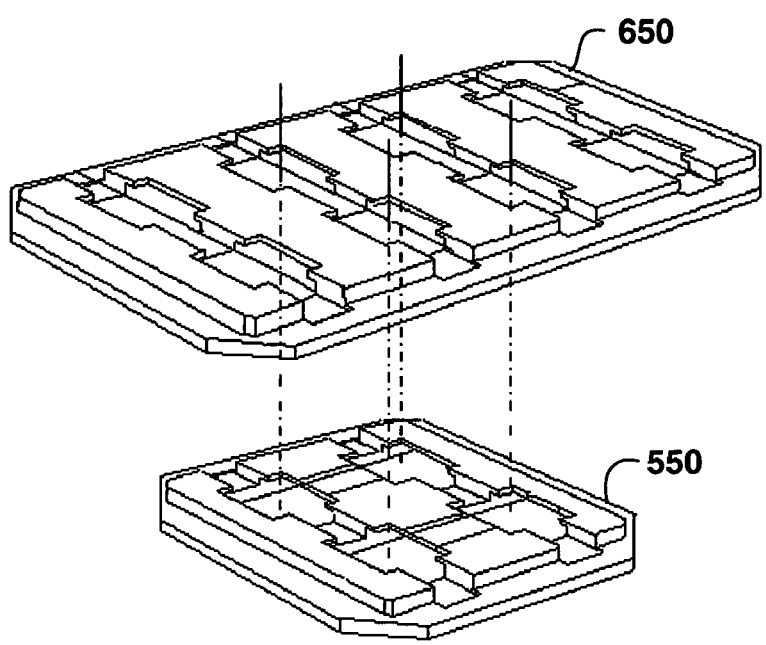
FIGS. 8 and 9 shows perspective views of the quad handler docking plate of FIG. 5 and the octal handler docking plate of FIG. 6.

FIGS. 8 and 9 shows perspective views of the quad handler docking plate 550 of FIG. 5 and the octal handler docking plate 650 of FIG. 6 illustrating how the four IC package openings of the quad handler docking plate align with the center four IC package openings of the octal handler docking plate.

Figure 10:
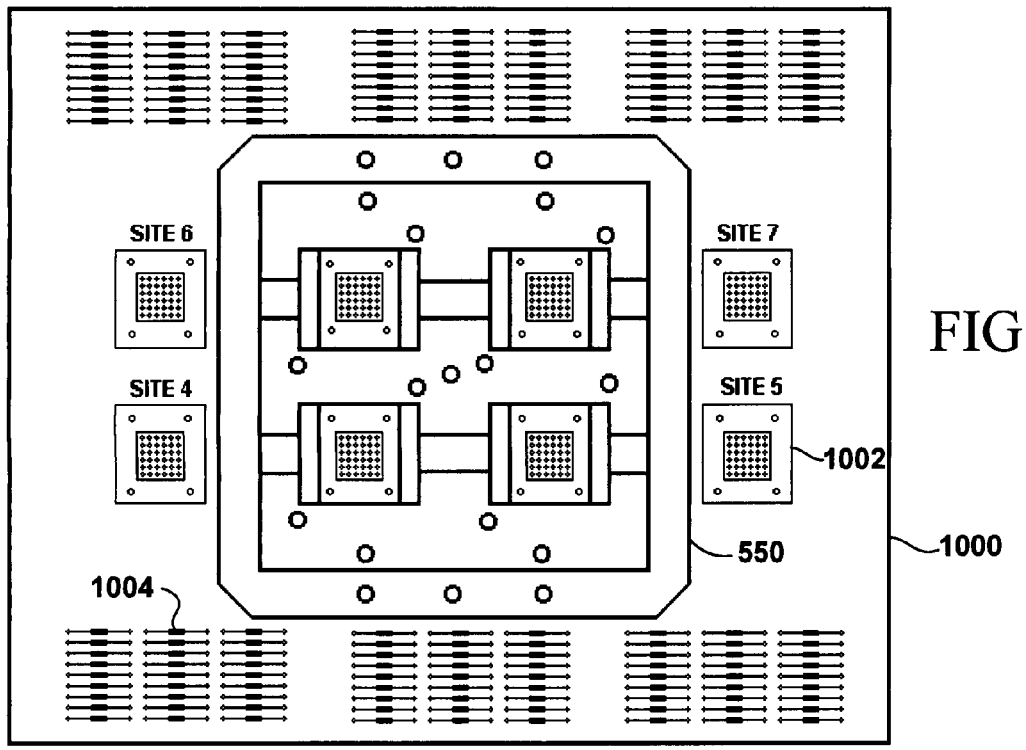
FIG. 10 shows a quad handler docking plate mounted on a PC board of an interface apparatus that has eight IC package test sites.

FIG. 10 shows a quad handler docking plate 550 of FIG. 5 mounted on a PC board 1000 of an interface apparatus that has eight IC package test sites 1002. The configuration of FIG. 10 illustrates that if octal handler docking plates are not available, quad handler plates can be used during testing, although testing will be limited to four IC packages at one time. The PC board includes external electrical contacts 1004 for attaching discrete test components, such as compensation capacitors. The compensation capacitors connect to conductive traces internal to the PC board that connect the test controller to contacts sites 1002.

Figure 11:
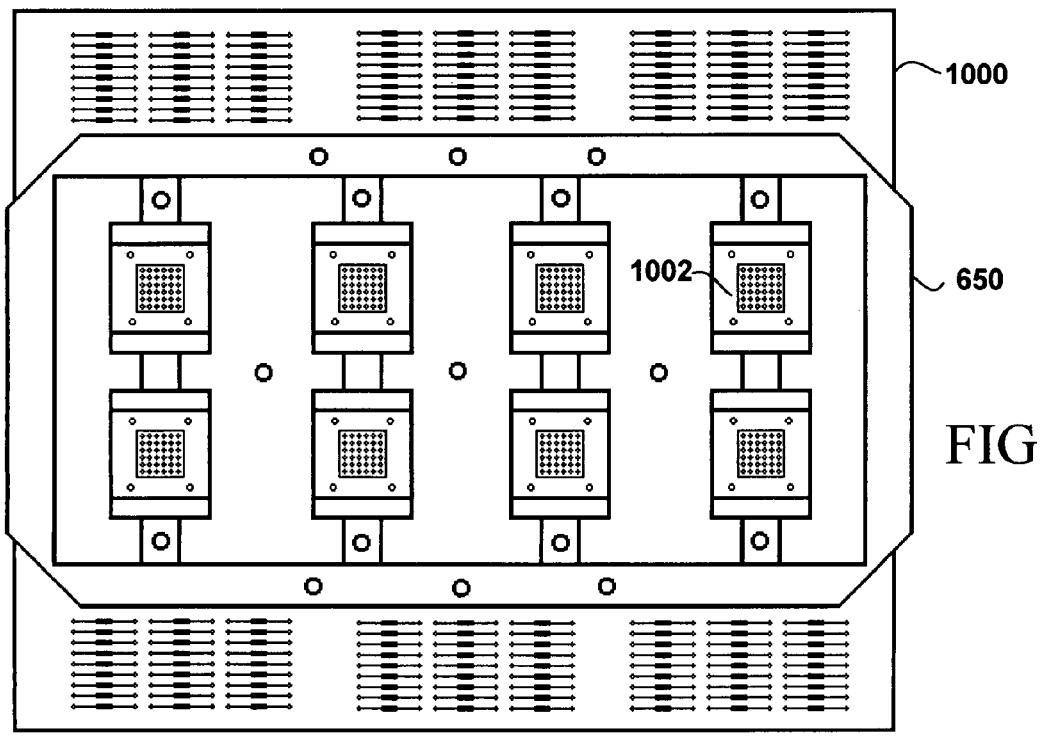
FIG. 11 shows an octal handler docking plate mounted on the PC board shown in FIG. 10, as opposed to the quad handler docking plate.

FIG. 11 shows an octal handler docking plate 650 mounted on the PC board 1000 shown in FIG. 10, as opposed to the quad handler docking plate 550. As shown, all IC package test contact sites 1002 for IC packages on the PC board 1000 are now confined within openings in the docking plate 650 to allow testing of eight IC packages at one time.

Although the present invention has been described above with particularity, this was merely to teach one of ordinary skill in the art how to make and use the invention. For example, although quad and octal handlers are shown and described, handlers with other numbers of openings can be made interchangeable according to embodiments of the present invention. Many additional modifications will fall within the scope of the invention, as that scope is defined by the following claims.

What is claimed is:

1. A system for testing integrated circuit (IC) packages comprising:
   a quad site docking plate having four openings for alignment of the IC packages;
   an octal site docking plate having eight openings for alignment of the IC packages;
   the quad site docking plate and the octal site docking plate being interchangeable for being separately mated with a printed circuit (PC) board, the PC board supporting attachments areas for separately mating with attachment areas of either the quad site docking plate or the octal site docking plate when in use so that the openings of either the quad site docking plate or the octal site docking plate fit around electrical contact sites of the PC board for mating with contacts on the IC packages held by either the quad site docking plate or the octal site docking plate, respectively, when in use;
   the PC board having traces associated with the electrical contact sites for testing the IC packages held in either the quad site docking plate or the octal site docking plate, respectively, when in use;
   a first number of the IC packages being four and being capable of placement respectively into the four openings of the quad site docking plate facilitated by first slanted walls for allowing alignment by sliding of the first number of the IC packages respectively into the four openings of the quad site docking plate; and
   when interchanging quad site docking plate for the octal site docking plate, a second number of the IC packages being eight and being capable of placement into the eight openings of the octal site docking plate facilitated by second slanted walls for allowing alignment by sliding of the second number of the IC packages respectively into the eight openings of the octal site docking plate; and
   the first slanted walls associated with the openings of the quad site docking plate by comparison being approximately orthogonal to the second slanted walls associated with the openings of the octal site docking plate with respect to separate placements of the quad site docking plate and the octal site docking plate in a frame.

2. The system of claim 1, wherein
   the frame has an opening for accepting an extended area of either the quad site docking plate or the octal site docking plate, the frame for attaching to the PC board and including attachment mechanisms for attaching to either the quad site docking plate or the octal site docking plate so that the openings of either the quad site docking plate or the octal site docking plate fit around the electrical contact sites of the PC board for mating with contacts on the IC packages held by either the quad site docking plate or the octal site docking plate, respectively.

3. The system of claim 2, wherein for the PC board including eight of the electrical contact sites, the quad site docking plate is capable of being attached to the PC board for not making electrical contact with four of the eight of the electrical contact sites.

4. The system of claim 1, wherein the openings of the quad site docking plate are associated with a similarly positioned four of the electrical contact sites central to four of the openings of the octal site docking plate.

5. The system of claim 1,
   wherein the first slanted walls of the quad site docking plate defining the four of the openings thereof include at least two opposing slanted walls to facilitate alignment by allowing sliding of the IC packages into the openings of the quad site docking plate for placement for the testing of the four of the IC packages at a time, and
   wherein the second slanted walls of the octal site docking plate defining the eight of the openings thereof include at least two opposing slanted walls to facilitate alignment by allowing sliding of the IC packages into the openings of the octal site docking plate for placement for the testing of the eight of the IC packages at a time.

6. A system for testing integrated circuit (IC) packages comprising:
- a first docking plate having a first number of openings for alignment of the IC packages;
- a second docking plate having a second number of openings for alignment of the IC packages, wherein the second number is greater than the first number;
- the first docking plate and the second docking plate being interchangeable for being separately mated with a printed circuit (PC) board, the PC board supporting attachments areas for separately mating with attachment areas of either the first docking plate or the second docking plate so that the openings of either the first docking plate or the second docking plate fit around electrical contact sites of the PC board for mating with contacts on the IC packages held by the either the first docking plate or the second docking plate, respectively, when in use;
- a first number of the IC packages capable of being placed into the first number of the openings of the first docking plate facilitated by first slanted walls for allowing alignment by sliding of the first number of the IC packages into the first number of openings of the first docking plate;
- when interchanging the first docking plate for the second docking plate, a second number of the IC packages capable of being placed into the second number of the openings of the second docking plate facilitated by second slanted walls for allowing alignment by sliding of the second number of the IC packages into the second number of openings of the second docking plate;
- the first slanted walls associated with the openings of the first docking plate and by comparison being approximately orthogonal to the second slanted walls associated with the openings of the second docking plate with respect to separate placements of the first docking plate and the second docking plate in a frame; and
- the PC board having traces associated with the electrical contact sites for testing the IC packages held in either the first docking plate or the second docking plate, respectively, when in use.

7. The system of claim 6, wherein
the frame has an opening for accepting an extended area of either the first docking plate or the second docking plate, the frame for attaching to the PC board and including attachment mechanisms for attaching to either the first docking plate or the second docking plate so that the openings of either the first docking plate or the second docking plate fit around the electrical contact sites of the PC board for mating with contacts on the IC packages held by either the first docking plate or the second docking plate, respectively.

8. The system of claim 6, wherein the first number of the openings of the first docking plate are associated with a similarly positioned number of the electrical contact sites central to the second docking plate.

9. The system of claim 6,
wherein the first slanted walls of the first docking plate include at least two opposing slanted walls to facilitate alignment by allowing sliding of the IC packages into the openings of the first docking plate for placement for the testing of four of the IC packages at a time; and
wherein the second slanted walls of the second docking plate include at least two opposing slanted walls to facilitate alignment by allowing sliding of the IC packages into the openings of the second docking plate for placement for the testing of eight of the IC packages at a time.

10. The system of claim 6,
wherein the first docking plate is capable of being attached to the PC board for not making electrical contact with additional sites included on the PC board associated with a portion of the second number of openings of the second docking plate.

11. A method for testing integrated circuit (IC) packages comprising:
- mounting a frame on a printed circuit (PC) board, the PC board having electrical contact sites for mating with contacts on the IC packages, wherein the contacts sites on the PC board are connected by traces in the PC board for electrical continuity with the contacts on the IC packages for the testing thereof;
- placing a first docking plate having a first number of openings for alignment with an equivalent number of the IC packages in the frame to the first number of the electrical contact sites on the PC board for the testing; and
- interchanging the first docking plate for a second docking plate in the frame, the second docking plate having a second number of openings different than the first number of openings, the second number of openings for alignment with an equal number of the IC packages to the second number of the electrical contact sites on the PC board;
- placing a first number of the IC packages into the first number of the openings of the first docking plate facilitated by first slanted walls for allowing alignment by sliding of the first number of the IC packages into the first number of openings of the first docking plate;
- after interchanging the first docking plate for the second docking plate, placing a second number of the IC packages into the second number of the openings of the second docking plate facilitated by second slanted walls for allowing alignment by sliding of the second number of the IC packages into the second number of openings of the second docking plate; and
- the first slanted walls associated with the openings of the first docking plate and by comparison being approximately orthogonal to the second slanted walls associated with the openings of the second docking plate with respect to separate placements of the first docking plate and the second docking plate in the frame.

12. The method of claim 11, wherein the second number of the electrical contact sites are a subset of the first number of the electrical contact sites.

13. The method of claim 12, wherein the second number of the electrical contact sites are provided in a central region of the first number of the electrical contact sites.

* * * * *